United States Patent
Lee et al.

(10) Patent No.: US 7,473,320 B2
(45) Date of Patent: Jan. 6, 2009

(54) APPARATUS FOR DEPOSITING AN ORGANIC MATERIAL ON A SUBSTRATE

(75) Inventors: Dong-Won Lee, Seongnam-si (KR); Joon-Hoo Choi, Seoul (KR); Jin-Koo Chung, Suwon-si (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 42 days.

(21) Appl. No.: 11/058,638

(22) Filed: Feb. 15, 2005

(65) Prior Publication Data

US 2005/0183661 A1  Aug. 25, 2005

(30) Foreign Application Priority Data

Feb. 19, 2004   (KR) .................. 10-2004-0010892

(51) Int. Cl.
*B05B 3/00* (2006.01)
*B05B 7/06* (2006.01)
*B05B 13/04* (2006.01)
*B05C 11/00* (2006.01)

(52) U.S. Cl. ................. 118/323; 118/313; 118/712; 347/19

(58) Field of Classification Search ......... 118/323, 118/46, 305, 324, 300, 321, 313, 712, 713; 347/19, 20, 47, 40, 5, 4
See application file for complete search history.

(56) References Cited

U.S. PATENT DOCUMENTS

| 4,675,696 | A | * | 6/1987 | Suzuki ................. 346/46 |
| 4,739,415 | A | * | 4/1988 | Toyono et al. ......... 358/296 |
| 5,670,995 | A | * | 9/1997 | Kupcho et al. ............. 347/5 |
| 6,299,274 | B1 | * | 10/2001 | Bolash et al. ............ 347/19 |
| 6,328,416 | B1 | * | 12/2001 | Moriyama ............... 347/40 |
| 6,667,795 | B2 | * | 12/2003 | Shigemura ............. 349/187 |
| 2002/0044163 | A1 | * | 4/2002 | Shigemura ............... 347/1 |
| 2003/0184613 | A1 | * | 10/2003 | Nakamura et al. ........ 347/40 |
| 2003/0189604 | A1 | * | 10/2003 | Bae et al. ................... 347/2 |
| 2003/0222936 | A1 | * | 12/2003 | Kaneko ................... 347/19 |

* cited by examiner

*Primary Examiner*—Yewebdar T Tadesse
(74) *Attorney, Agent, or Firm*—F. Chau & Assoc., LLC

(57) ABSTRACT

An apparatus includes a drop unit, a transfer unit and a position adjusting unit. The drop unit drops droplets of an organic material. The transfer unit transfers the drop unit along a first direction. The position adjusting unit is interposed between the drop unit and the transfer unit to adjust a position of the drop unit. Therefore, the apparatus of dropping the organic material has a small size and may drop droplets of the organic material onto an accurate position. Furthermore, the transfer unit moves the drop unit quickly, and the position adjusting unit adjusts the position of the drop unit accurately. Therefore, a time difference for drying the organic material injected into a cavity is reduced.

20 Claims, 5 Drawing Sheets

APPARATUS FOR DEPOSITING AN ORGANIC MATERIAL ON A SUBSTRATE

CROSS-REFERENCE TO RELATED APPLICATIONS

This application claims priority to Korean Patent Application No. 2004-10892 filed on Feb. 19, 2004, the contents of which are herein incorporated by reference in its entirety.

BACKGROUND OF THE INVENTION

1. Technical Field

The present invention relates to an apparatus for depositing an organic material on a substrate. More particularly, the present invention relates to an apparatus for depositing an organic material droplet on a substrate.

2. Discussion of the Related Art

Generally, a display apparatus displays an image using data processed by an information processing apparatus.

The different types of display apparatus include a cathode ray tube (CRT) apparatus, a liquid crystal display (LCD) apparatus, an organic light emitting diode (OLED) apparatus, a plasma display panel (PDP), etc. The CRT displays an image by controlling an electron beam applied to a fluorescent layer. The LCD displays an image by orienting liquid crystals. The OLED displays an image by currents that flow through an organic light emitting layer. The PDP displays an image by plasma.

The OLED has features such as being thin in thickness, high luminance, full color, low power consumption, and low manufacturing cost, etc.

The OLED includes an anode electrode arranged in a matrix shape on a substrate, an organic layer formed on the substrate and having an opening through which a portion of the anode electrode is exposed, an organic light emitting layer formed on the anode electrode exposed by the organic layer, and a cathode electrode formed on the organic light emitting layer.

The organic light emitting layer of the OLED includes a hole injection layer (HIL), an emitting material layer (EML) and an electron injection layer (EIL).

The organic light emitting layer can be formed by processes such as a slit mask, a spin coating, a roll-to-roll, a vacuum deposition, etc. Recently, a dropping method is employed, wherein a droplet of an organic material is dropped into a cavity formed at the organic layer.

An apparatus for dropping a droplet of an organic material typically includes an organic material dropping unit and a transfer unit which transfers the organic material dropping unit. In the conventional apparatus, injecting the organic material at once into the cavity arranged in a matrix shape may be difficult. The conventional apparatus scans organic material cavities and injects the organic material into the cavities as the dropping unit traverses along the layer.

When a drying time of the organic material injected into the cavity is different, the organic light emitting layers of each cavity have a profile different from each other and light generated from an organic light emitting layer may have different luminance. Therefore, display quality is deteriorated.

Recently, an apparatus is used for simultaneously dropping organic materials along a layer to form a more uniform light emitting layer.

Such apparatus uses a plurality of organic material dropping units and a plurality of transfer units. The transfer units correspond to the organic material dropping units. However, such apparatus of dropping the organic material is larger in size.

SUMMARY OF THE INVENTION

An exemplary apparatus of dropping an organic material according to the present invention includes a drop unit, a transfer unit and a position adjusting unit. The drop unit drops droplets of the organic material. The transfer unit transfers the drop unit along a first direction. The position adjusting unit is disposed between the drop unit and the transfer unit to adjust a position of the drop unit.

In another exemplary apparatus of dropping an organic material according to the present invention, an apparatus includes at least two drop units, a transfer unit, a combination unit and a position adjusting unit. The drop units drop droplets of the organic material. The drop units can be arranged in series. The transfer unit transfers the drop units in a first direction. The combination unit is interposed between the drop units and the transfer unit to connect the drop units to the transfer unit. The position adjusting unit is interposed between the drop units and the combination unit so as to adjust a distance between the drop units and adjust a position of the drop units.

In another exemplary apparatus of dropping an organic material according to the present invention, an apparatus includes a first drop apparatus, a second drop apparatus, a first position adjusting unit and a second position adjusting unit. The first drop apparatus includes a first drop unit that drops droplets of the organic material, and a first transfer unit that is connected to the first drop unit to transfer the first drop unit along a first direction. The second drop apparatus includes a second drop unit that drops droplets of the organic material, and a second transfer unit that is connected to the second drop unit to transfer the second drop unit along the first direction. The second drop apparatus is spaced apart from the first drop apparatus along a second direction that is substantially perpendicular to the first direction. The first position adjusting unit is interposed between the first drop unit and the first transfer unit to adjust a position of the first drop unit. The second position adjusting unit is interposed between the second drop unit and the second transfer unit to adjust a position of the second drop unit.

According to an illustrative embodiment of the present invention, an apparatus of depositing organic material accurately deposits droplets of the organic material onto target positions.

Furthermore, a transfer unit moves the drop unit quickly, and the position adjusting unit accurately adjusts the position of the drop unit. Therefore, the time difference for drying the organic material injected into cavities is reduced.

BRIEF DESCRIPTION OF THE DRAWINGS

The above and other features of the present invention will become more apparent by describing in detailed exemplary embodiments thereof with reference to the accompanying drawings, in which.

DESCRIPTION OF EMBODIMENTS

Figure 1:
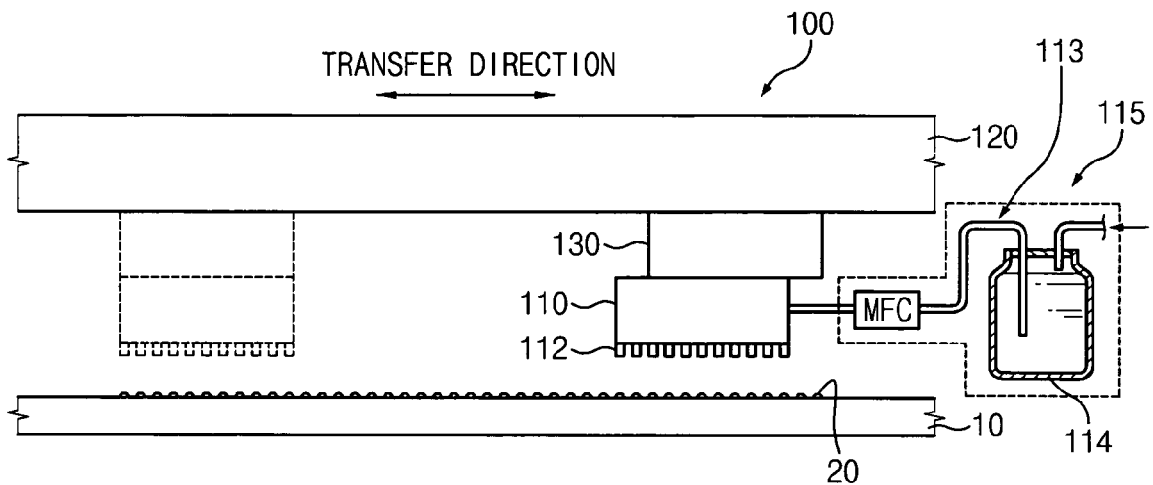
FIG. 1 is a schematic view illustrating an apparatus of dropping an organic material according to an embodiment of the present invention.

FIG. 1 is a schematic view illustrating an apparatus of dropping an organic material according to a first exemplary embodiment of the present invention. Referring to FIG. 1, an apparatus 100 includes a drop unit 110, a transfer unit 120 and a position adjusting unit 130. The drop unit 110 deposits or drops droplets of the organic material such as an organic light emitting material, a composition of color filter, etc., onto a substrate 10 to form an organic pattern 20 on the substrate 10. The drop unit 110 includes a plurality of nozzles 112. The organic pattern 20 is formed using the organic material dropped through the nozzles 112. The nozzles 112 are disposed to face the substrate 10. The nozzles 112 are arranged such that a distance between the nozzles 112 is in a range from a few μm to hundreds of μm.

The drop unit 110 may further include an organic material providing unit 115 that provides the drop unit 110 with the organic material. The organic material providing unit 115 may include an organic material containing tank 114 and a pipe 113. The organic material in the organic material containing tank 114 is transferred to the nozzle 112 through the pipe 113. The organic material providing unit 115 may further include a Mass Flow Controller (MFC). The MFC controls an amount of the organic material that flows through the pipe 113.

The transfer unit 120 transfers the drop unit 110. When the drop unit 110 arrives at a predetermined point, the transfer unit 120 stops transferring the drop unit 110. To accurately control the transfer unit 120 that stops the drop unit 110 at the predetermined point, the apparatus 100 includes the position adjusting unit 130. The position adjusting unit 130 adjusts the predetermined point, so that the drop unit may drop the organic material accurately. The position adjusting unit 130 can move the drop unit 110 along the same direction as the direction which the transfer unit 120 moves the drop unit 110.

Figure 2:
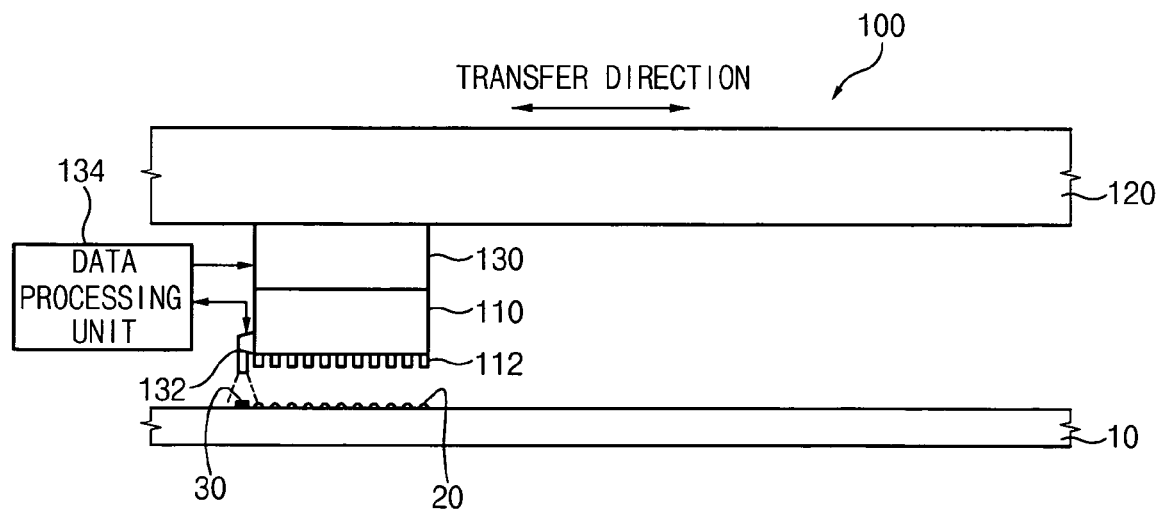
FIG. 2 is a schematic view illustrating an apparatus of dropping an organic material having a data processing unit according to an exemplary embodiment of the present invention.

Referring to FIG. 2, the position adjusting unit 130 further includes a position measuring unit 132 and a data processing unit 134. The position measuring unit 132 measures a position of the drop unit 110 using a position detecting device. Preferably, the position detecting device takes a picture of an alignment key 30, and the position measuring unit 132 measures a position of the drop unit 110 by using at least two alignment keys. A charge-coupled device (CCD) camera may be used as the position detecting device.

The data processing unit 134 receives position data containing position information of the drop unit 110 from the position measuring unit 132, and processes the position data to form arrangement data. The arrangement data includes information of the drop unit 110. For example, the arrangement data can indicate if the drop unit 110 is located at a proper position, or a distance between a target position and current position, etc. The arrangement data is applied to the position adjusting unit 130 for adjusting the position of the drop unit 110. According to the present embodiment, the position of the drop unit 110 may be compensated by the position measuring unit 132 and the data processing unit 134. Therefore, the drop unit 110 may be disposed more accurately.

Figure 3:
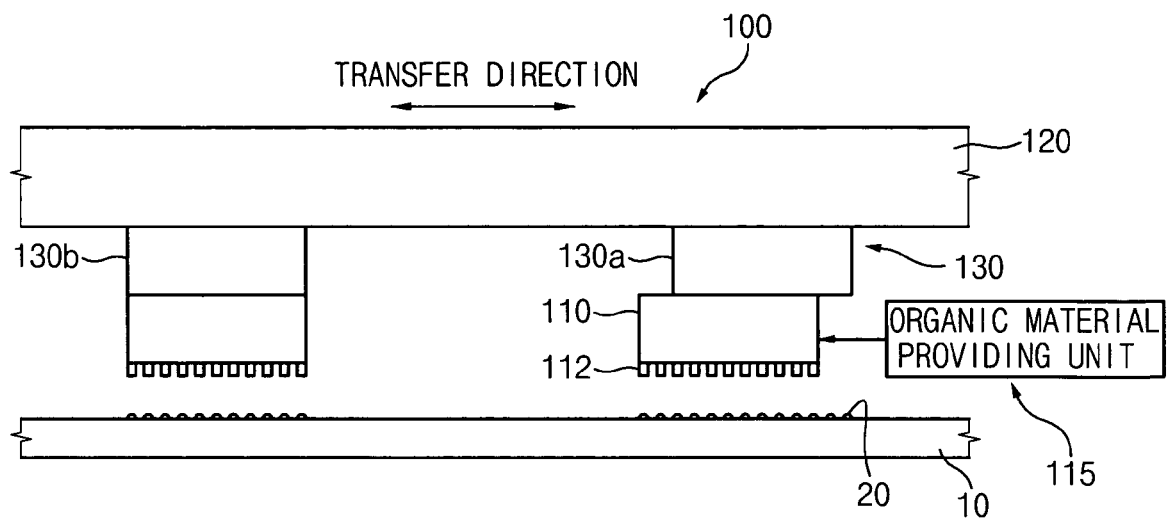
FIG. 3 is a schematic view illustrating an apparatus of dropping an organic material according to another exemplary embodiment of the present invention.

FIG. 3 is a schematic view illustrating an apparatus of dropping an organic material according to another embodiment of the present invention. The apparatus of dropping the organic material of the present embodiment is same as in the above embodiment except for the position adjusting unit. The same reference numerals will be used to refer to the same or like parts as those described in the above embodiment.

Referring to FIG. 3, an apparatus 100 of dropping an organic material of the present embodiment includes a plurality of position adjusting units 130. Two units 130a and 130b are shown for illustration. The position adjusting units 130 are fixed to a transfer unit 120 and as such the distance between the position adjusting units 130 remains the same when the position adjusting units 130 are moved. Each of the drop units 110 is coupled to and controlled by its respective position adjusting unit 130. Preferably, the drop units 110 are spaced apart from each other by a distance equivalent to the widths of multiple nozzles 112 of the drop units 110.

When a distance between the drop units 110 is different than the desired distance, the droplets of the organic material dropped by the nozzles 112 of the drop unit 110 may become irregular. The position adjusting units 130 can be used to adjust the distance between the drop units 110.

Figure 4:
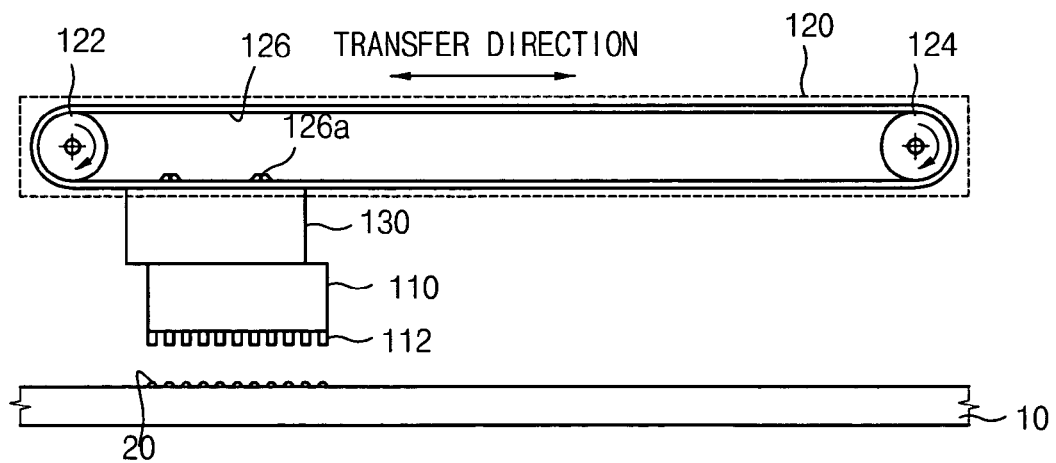
FIG. 4 shows details of a transfer unit in an apparatus of dropping an organic material.

FIG. 4 shows further details of a transfer unit 120 according to the present embodiment. The transfer unit 120 includes a conveyer belt 126 and driver units 122 and 124. The conveyer belt 126 is preferably a closed curve belt. The driver units 122 and 124 are disposed inside the conveyer belt 126, and spaced apart from each other such that the conveyer belt 126 has a predetermined tension. The driver unit 122 corresponds to a driver roller connected to a motor, and the driver unit 124 corresponds to a driven roller, or vice versa. The driver roller 122 drives the conveyer belt 126, and the driven roller 124 is rotated by the conveyer belt 126 that is driven by the driver roller 122. The position adjusting unit 130 is held to the conveyer belt 126, and the drop unit 110 is installed at the position adjusting unit 130.

In the present embodiment, the conveyer belt 126 transfers the position adjusting unit 130 and the drop unit 110. Alternatively, the transfer unit 120 may employ other apparatus that may reciprocate the position adjusting unit 130, for example, such as a hydraulic cylinder, a ball screw apparatus and so on.

As shown in FIG. 4, an apparatus of dropping the organic material employs the conveyer belt 126 as the transfer unit 120 that moves the position adjusting unit 130 and the drop unit 110.

Figure 5:
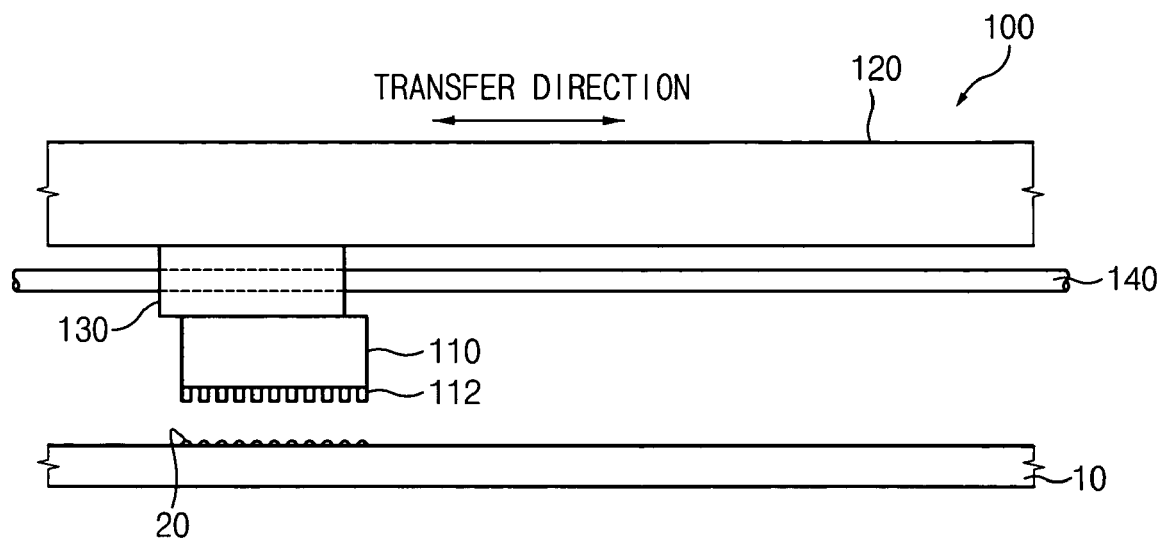
FIG. 5 shows an apparatus of dropping an organic material with a guide rail according to an exemplary embodiment of the present invention.

Referring to FIG. 5, when a transfer unit 120 transfers a position adjusting unit 130 and a drop unit 110, the position adjusting unit 130 and a drop unit 110 may shift in position, so that the drop unit 110 may not drop droplets of the organic material onto a desired position. To stabilize the adjusting unit 130 and the drop unit 110, an apparatus of dropping the organic material may include a guide rail 140 that guides the position adjusting unit 130.

Alternatively, an additional guide rail (not shown) may be used to guide the drop unit 110. Preferably, the position adjusting unit 130 rides on the guide rail 140 to prevent a shift in the position adjusting unit 130 and the drop unit 110. The guide rail 140 can be a cylindrical rod shape.

Figure 6:
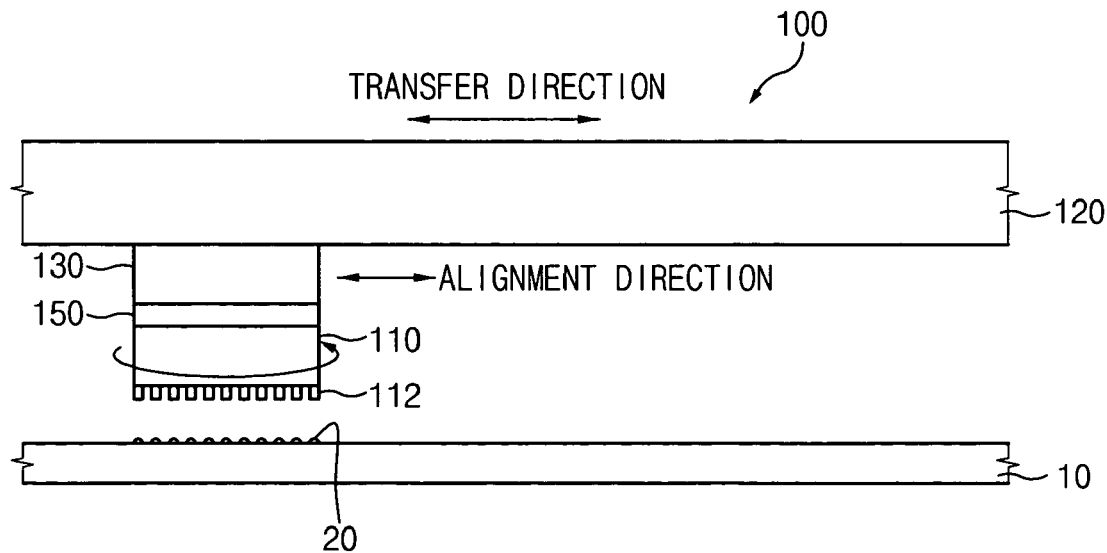
FIG. 6 is a schematic view illustrating an apparatus of dropping an organic material according to another embodiment of the present invention.

FIG. 6 shows a drop unit in further detail. An apparatus 100 of dropping an organic material further includes a rotating unit 150. The rotating unit 150 is interposed between a position adjusting unit 130 and a drop unit 110. The rotating unit 150 rotates the drop unit 110 with respect to a substrate 10. The rotating unit 150 includes a motor (not shown) and gears (not shown).

The nozzles 112 used for injecting the organic material may have a distance between nozzles that is smaller than a distance between the cavities 20 on the substrate 10. According to the present embodiment, the use of the rotating unit 150, facilitates depositing droplets of the organic material at cavities of which the distance is smaller than the distance between nozzles 112 of the drop unit 110.

Figure 7:
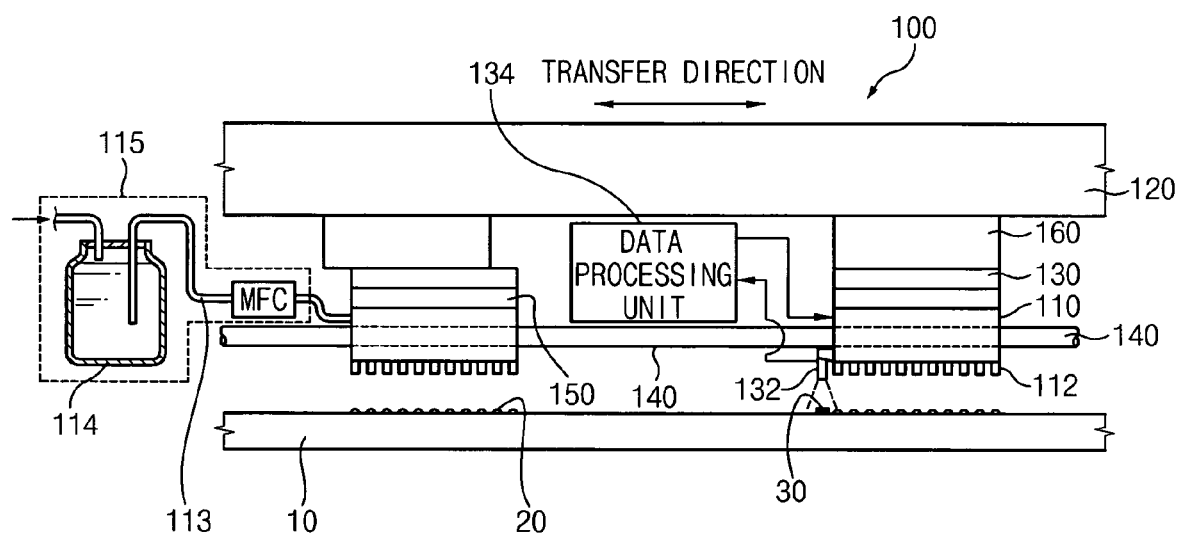
FIG. 7 is a schematic view illustrating an apparatus of dropping an organic material according to still another embodiment of the present invention.

FIG. 7 is a schematic view illustrating an apparatus of dropping an organic material according to still another exemplary embodiment of the present invention. Referring to FIG. 7, an apparatus 100 of dropping an organic material includes a drop unit 110, a transfer unit 120, a combination unit 160 and a position adjusting unit 130.

The apparatus 100 of dropping the organic material includes at least one drop unit 110. In this illustrative embodiment, there are two drop units 110 arranged side by side along the path of travel. Each of the drop units 110 includes a plurality of nozzles 112. The nozzles 112 are arranged linearly but can be arranged as in an array (not shown). The distance between the nozzles 112 is in a range from a few μm to hundreds of μm. An organic material providing unit 115 provides the drop units 110 with organic material. The organic material providing unit 115 may include an organic material containing tank 114 and a pipe 113. The organic material in the organic material containing tank 114 is transferred to the nozzles 112 through the pipe 113. The organic material providing unit 115 may further include a Mass Flow Controller (MFC). The MFC controls an amount of the organic material that flows through the pipe 113.

The drop unit 110 may be combined with a rotating unit 150. The rotating unit 150 rotates the drop unit 110 with respect to the substrate 10. The rotating unit 150 includes a motor (not shown) and gears (not shown). Therefore, the apparatus 100 of dropping the organic material may provide cavities of which a distance is smaller than a distance between the drop nozzles 112. A guide rail 140 is provided to guide the drop unit 110. The transfer unit 120 transfers the drop unit 110. The transfer unit 120 may use a transferring member such as a conveyer belt, a hydraulic cylinder, a ball screw apparatus and so on.

A combination unit 160 is coupled to transfer unit 120 to engage and transfer the position adjusting unit 130 and the drop unit 110. The position adjusting unit 130 is interposed between the combination unit 160 and the drop unit 110 and controls a position of the drop unit 110 such that the drop unit 110 drops droplets of the organic material accurately onto targeted positions.

The position adjusting unit 130 may include a position measuring unit 132 and a data processing unit 134. The position measuring unit 132 measures a position of the drop unit 110. To measure the position of the drop unit 110, the position measuring unit 132 includes a position detecting device that takes a picture of an alignment key 30. For example, a charge-coupled device (CCD) camera may be used as the position detecting device. The position measuring unit 132 measures the position of the drop unit 110 by using at least two alignment keys 30. The data processing unit 134 receives position data containing position information of the drop unit 110 from the position measuring unit 132, and processes the position data to form arrangement data. The arrangement data includes information of the drop unit 110. For example, the arrangement data can indicate if the drop unit 110 is located at a proper point, or a distance between a target and the current position, etc. The arrangement data are applied to the position adjusting unit 130 to adjust the position of the drop unit 110.

Figure 8:
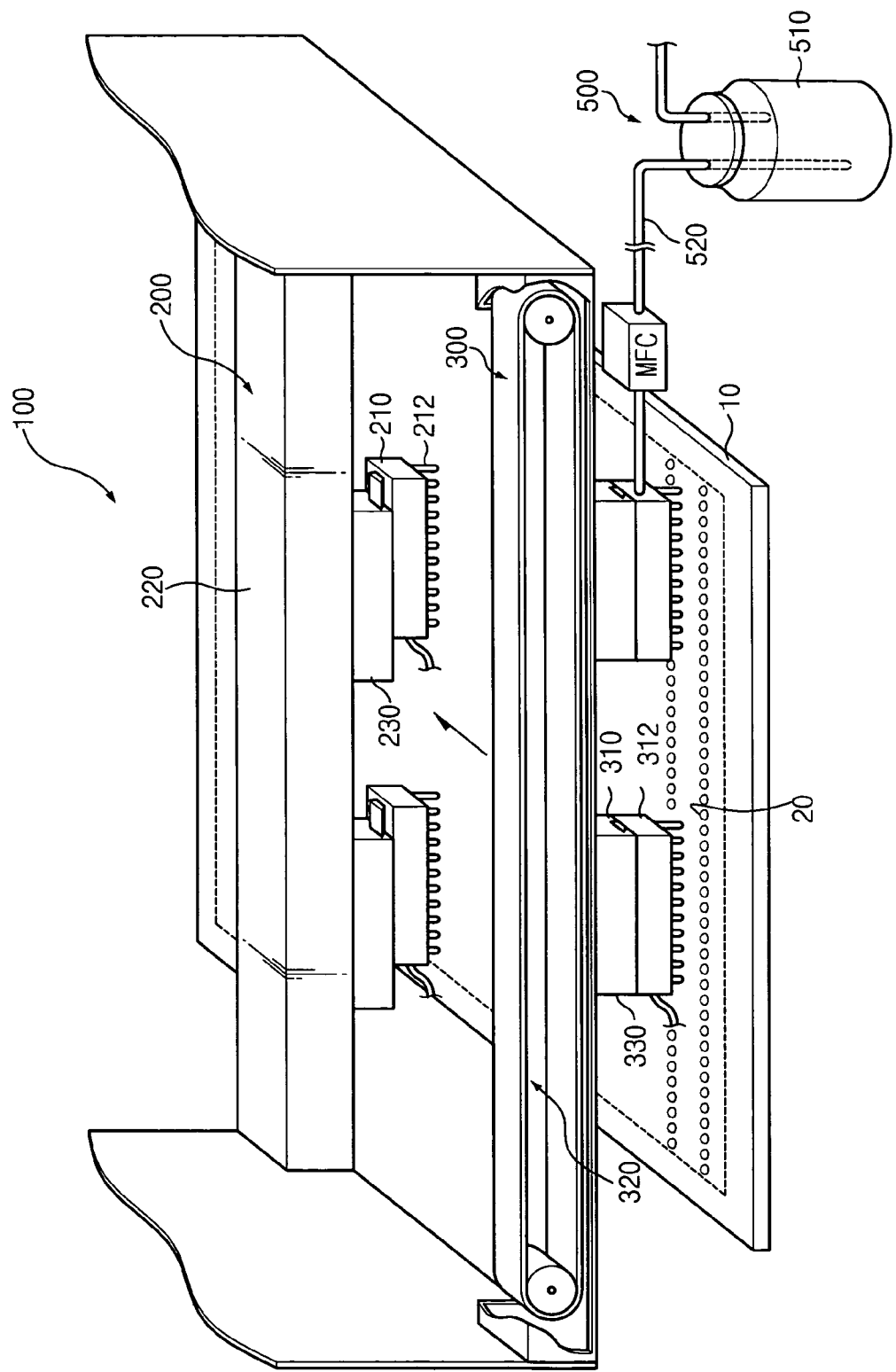
FIG. 8 is a perspective view of an apparatus of dropping an organic material according to another embodiment of the present invention.

FIG. 8 is a schematic view illustrating an apparatus of dropping an organic material according to still another embodiment of the present invention. Referring to FIG. 8, an apparatus 100 of dropping the organic material includes a first drop apparatus 200 and a second drop apparatus 300. The first drop apparatus 200 includes a first drop unit 210, a first transfer unit 220 and a first position adjusting unit 230.

The first drop unit 210 drops the organic material, for example, an organic light emitting material, a composition of color filter, etc., toward a substrate 10. Then, organic patterns 20 are formed on the substrate 10. The apparatus 100 of dropping the organic material includes at least one first drop unit 210. In the present embodiment, the apparatus 100 of dropping the organic material includes a plurality of the first drop units 210.

The first drop units 210 are arranged side-by-side along the path of travel of the transfer unit 220. Each of the first drop units 210 includes a plurality of drop nozzles 212. The first drop nozzles 212 are formed at the first drop unit 210 such that the first drop nozzles 212 face the substrate 10 and a distance between the drop nozzles 212 is in a range from a few μm to hundreds of μm.

An organic material providing unit 500 includes an organic material containing tank 510 and a pipe 520 through which the organic material in the organic material containing tank 510 is provided to the drop nozzles 212. The organic material providing unit 500 may further include an MFC for controlling an amount of the organic material that flows through the pipe 520. The organic material providing unit 500 provides both of the first and second drop apparatuses 200 and 300 with the organic material.

The first transfer unit 220 transfers the first drop unit 210 in a predetermined direction. Preferably, the first transfer unit 220 linearly moves the first drop unit 210. When the first drop unit 210 arrives at a predetermined position, the first transfer unit 220 stops operating. A distance between the first drop nozzles 212 is a few μm to hundreds of μm. To control the position of the first drop nozzles 212 more accurately, a first position adjusting unit 230 is disposed at the first drop unit 210. The first position adjusting unit 230 is disposed between the first transfer unit 220 and the first drop unit 210, so that the first position adjusting unit 230 moves with the first transfer unit 220. The first position adjusting unit 230 moves the first drop unit 210 along the direction of travel of the first transfer unit 220. The first position adjusting unit 230 may employ a device which reciprocates movement of the first drop unit 210.

The second drop apparatus 300 includes a second drop unit 310, a second transfer unit 320 and a second position adjusting unit 330. The second drop unit 310 drops the organic material, for example, an organic light emitting material, a composition of color filter, etc., toward the substrate 10. Then, organic patterns 20 are formed on the substrate 10. The apparatus 100 of dropping the organic material includes at least one second drop unit 310. In the present embodiment, the apparatus 100 of dropping the organic material includes a plurality of the second drop units 310.

The second drop units 310 are also arranged side-by-side along the path of travel of the transfer unit 220. The second drop units 310 are arranged similarly as the first drop units 210.

Each of the second drop units 310 includes a plurality of second drop nozzles 312. The second drop nozzles 312 are formed at the second drop units 310 such that the second drop nozzles 312 face the substrate 10. The second display nozzles 312 are spaced apart from each other. A distance between the second display nozzles 312 is in a range from about a few μm to about hundreds μm.

The arrangement of first drop nozzles 212 and the second drop nozzles 312 is such that the first drop nozzles 212 are arranged along a first line, and the second drop nozzles 312 are arranged along a second line that is substantially parallel with the first line. Therefore, the first drop nozzles 212 and the second drop nozzles 312 drop droplets of the organic material onto different rows or columns of the array. Further, the first drop nozzles 212 and the second nozzles 312 can be arranged in a zigzag order wherein a first drop nozzle is positioned between the second nozzles or a second nozzle is positioned in between the first nozzles.

The organic material providing unit 500 provides also the second drop unit 310 with the organic material.

The second transfer unit 320 transfers the second drop unit 310 in a predetermined direction. The first and second transfer units 220 and 320 can be independently operated. To better control the position of the second drop nozzles 312, a second position adjusting unit 330 is disposed at the second drop unit 310. The second position adjusting unit 330 is disposed between the second transfer unit 320 and the second drop unit 310, so that the second position adjusting unit 330 moves with the second transfer unit 320.

The second position adjusting unit 330 moves the second drop unit 310 along the path of movement of the second transfer unit 320. The second position adjusting unit 330 may employ an apparatus that reciprocates the second drop unit 310.

Having described the exemplary embodiments of the present invention and its advantages, it is noted that various changes, substitutions and alterations can be made herein without departing from the spirit and scope of the invention as defined by appended claims.

What is claimed is:

1. An apparatus for depositing an organic material on a substrate, comprising:
    a drop unit that drops a droplet of the organic material;
    a transfer unit that moves the drop unit along a first direction relative to the substrate, wherein the transfer unit has a casing and both end portions of the casing are fixed to a frame of the apparatus; and
    a position adjusting unit that is attached to the transfer unit and interposed between the drop unit and the transfer unit to adjust a position of the drop unit, wherein the position adjusting unit moves relative to the transfer unit linearly in the first direction and alternatively linearly in a second direction opposite to the first direction, wherein the drop unit moves relative to the position adjusting unit linearly in the first direction and alternatively linearly in the second direction.

2. The apparatus of claim 1, wherein the drop unit comprises a plurality of nozzles through which the organic material passes, the nozzles being arranged along the first direction.

3. The apparatus of claim 1, wherein the position adjusting unit comprises a reciprocating unit to reciprocate the drop unit in the first direction and in the second direction.

4. The apparatus of claim 1, wherein the position adjusting unit further comprises a position measuring unit that measures a position of the drop unit relative to the substrate.

5. The apparatus of claim 1, further including a second drop unit transferred in the first direction by the transfer unit.

6. The apparatus of claim 1, wherein the transfer unit comprises:
    a conveyer belt that moves the drop unit coupled to the position adjusting unit; and
    a driver unit that drives the conveyer belt.

7. The apparatus of claim 1, further comprising a guide rail that guides the position adjusting unit.

8. The apparatus of claim 1, further comprising a rotating unit that rotates the drop unit relative to the substrate.

9. The apparatus of claim 1, further comprising a position measuring unit to measure the position of the drop unit relative to the substrate.

10. The apparatus of claim 9, further including a data processing unit to process data from the position measuring unit and determine the position of the drop unit.

11. An apparatus for dropping an organic material, comprising:
    at least two drop units that drop droplets of the organic material;
    a transfer unit that moves the drop units in a first direction, wherein the unit has a casing and both end portions of the casing are fixed to a frame of the apparatus;
    a combination unit that is interposed between the drop units and the transfer unit to couple the drop units to the transfer unit; and
    a position adjusting unit that is attached to the transfer unit and interposed between each of the at least two drop units and the combination unit to control a distance between the drop units and adjust a position of the drop units, wherein
    the position adjusting unit moves relative to the transfer unit linearly in the first direction and alternatively linearly in a second direction,
    the at least two drop units move relative to the position adjusting unit linearly in the first direction and alternatively linearly in the second direction opposite to the first direction.

12. The apparatus of claim 11, wherein each of the at least two drop units comprises a plurality of nozzles through which the organic material is passed, the nozzles being arranged along the first direction.

13. The apparatus of claim 11, wherein the position adjusting unit comprises an apparatus that reciprocates the drop units in the first direction or in the second direction to adjust the distance between the at least two drop units.

14. The apparatus of claim 11, wherein the transfer unit comprises:
    a conveyer belt that moves the at least two drop units; and
    a driver unit that drives the conveyer belt.

15. The apparatus of claim 11, further comprising a guide rail that guides the at least two drop units.

16. The apparatus of claim 11, further comprising a position detecting device that takes a picture of a position of one of the at least two drop units to determine the position of one of the drop units.

17. The apparatus of claim 11, further comprising at least one rotating unit that rotates one of the at least two drop units.

18. An apparatus for dropping an organic material, comprising:
    a first drop apparatus including a first drop unit that drops droplets of the organic material, and a first transfer unit that is coupled to the first drop unit to transfer the first drop unit along a first direction;

a second drop apparatus including a second drop unit that drops droplets of the organic material, and a second transfer unit that is coupled to the second drop unit to move the second drop unit along the first direction, the second drop apparatus being spaced apart from the first drop apparatus along a second direction that is substantially perpendicular to the first direction;

a first position adjusting unit that is attached to the first transfer unit and interposed between the first drop unit and the first transfer unit to adjust a position of the first drop unit; and a second position adjusting unit that is attached to the second transfer unit and interposed between the second drop unit and the second transfer unit to adjust a position of the second drop unit, wherein the first position adjusting unit moves relative to the first transfer unit linearly in the first direction and alternatively linearly in a third direction opposite to the first direction, and the first drop unit moves relative to the first position adjusting unit linearly in the first direction and alternatively linearly in the third direction, the second position adjusting unit moves relative to the second transfer unit linearly in the first direction and alternatively linearly in the third direction the second drop unit moves relative to the second position adjusting unit linearly in the first direction and alternatively linearly in the third direction, wherein the first transfer unit and the second transfer unit have a common casing and both end portions of the casing are fixed to a frame of the apparatus.

19. The apparatus of claim 18, further including another of the first drop unit and another of the second drop unit, wherein each of the second drop units are disposed between the first drop units.

20. The apparatus of claim 18, further including a first rail and a second rail for guiding the corresponding first and second drop units.

* * * * *